(12) United States Patent
Kim et al.

(10) Patent No.: US 10,460,850 B2
(45) Date of Patent: Oct. 29, 2019

(54) THERMOELECTRIC COMPOSITE MATERIAL AND METHOD FOR PREPARING THERMOELECTRIC COMPOSITE MATERIAL

(71) Applicant: Korea Institute of Machinery & Materials, Daejeon (KR)

(72) Inventors: Kyung Tae Kim, Busan (KR); Yeong-seong Eom, Daegu (KR); Young Kuk Kim, Changwon-si (KR); Jae-yeol Woo, Busan (KR)

(73) Assignee: Korea Institute of Machinery & Materials, Daejeon (KR)

( * ) Notice: Subject to any disclaimer, the term of this patent is extended or adjusted under 35 U.S.C. 154(b) by 0 days.

(21) Appl. No.: 15/516,754

(22) PCT Filed: Nov. 12, 2015

(86) PCT No.: PCT/KR2015/012187
§ 371 (c)(1),
(2) Date: May 25, 2017

(87) PCT Pub. No.: WO2016/076649
PCT Pub. Date: May 19, 2016

(65) Prior Publication Data
US 2018/0108449 A1 Apr. 19, 2018

(30) Foreign Application Priority Data
Nov. 12, 2014 (KR) ........................ 10-2014-0157018

(51) Int. Cl.
*H01B 1/18* (2006.01)
*B22F 9/04* (2006.01)
(Continued)

(52) U.S. Cl.
CPC ............. *H01B 1/18* (2013.01); *B22F 1/0018* (2013.01); *B22F 9/24* (2013.01); *C01B 32/198* (2017.08);
(Continued)

(58) Field of Classification Search
None
See application file for complete search history.

(56) References Cited

U.S. PATENT DOCUMENTS

| 8,845,918 B2 | 9/2014 | Kim et al. |
| 2011/0284804 A1 | 11/2011 | Kim et al. |

(Continued)

FOREIGN PATENT DOCUMENTS

| JP | 2011249749 A | 12/2011 |
| JP | 5214695 B2 | 6/2013 |

(Continued)

OTHER PUBLICATIONS

"Tailored Assembly of Graphene from Solvent Dispersion," Polymer science and technology, v. 2 No. 2, 2011, pp. 130-136.
(Continued)

*Primary Examiner* — Katie L. Hammer
(74) *Attorney, Agent, or Firm* — Harness, Dickey & Pierce, P.L.C.

(57) ABSTRACT

The present invention relates to a thermoelectric composite material and a method for preparing a thermoelectric composite material. Specifically, the invention relates to a thermoelectric composite material in which graphene oxide attached with conductive metal nanoparticles is dispersed in a thermoelectric material and a method for preparing a thermoelectric composite powder comprising the steps of: growing conductive metal nanoparticles on the surface of graphene oxide (step 1); and introducing the graphene oxide attached with the conductive metal nanoparticles prepared in
(Continued)

step 1 into a thermoelectric material precursor solution, followed by heat treatment (step 2).

16 Claims, 13 Drawing Sheets

(51) Int. Cl.

| | | |
|---|---|---|
| *B22F 9/24* | (2006.01) | |
| *C22C 47/14* | (2006.01) | |
| *C22C 49/12* | (2006.01) | |
| *H01L 35/22* | (2006.01) | |
| *H01L 35/26* | (2006.01) | |
| *H01L 35/34* | (2006.01) | |
| *C01B 32/198* | (2017.01) | |
| *B22F 1/00* | (2006.01) | |
| *C22C 1/05* | (2006.01) | |

(52) U.S. Cl.
CPC ............... *C22C 1/05* (2013.01); *C22C 47/14* (2013.01); *C22C 49/12* (2013.01); *H01L 35/22* (2013.01); *H01L 35/26* (2013.01); *H01L 35/34* (2013.01); *B22F 9/04* (2013.01); *B22F 2009/043* (2013.01); *Y02P 20/129* (2015.11)

(56) References Cited

U.S. PATENT DOCUMENTS

| | | | |
|---|---|---|---|
| 2014/0008589 A1 | 1/2014 | Kim et al. | |
| 2014/0219906 A1* | 8/2014 | Kim | C01B 32/194 |
| | | | 423/439 |
| 2015/0179294 A1* | 6/2015 | Kim | H01B 1/04 |
| | | | 428/402 |
| 2015/0380625 A1* | 12/2015 | Freer | H01L 35/22 |
| | | | 136/238 |
| 2016/0064726 A1* | 3/2016 | Ikenuma | H01M 4/133 |
| | | | 429/231.8 |
| 2016/0276056 A1* | 9/2016 | Stolyarov | H01B 1/04 |

FOREIGN PATENT DOCUMENTS

| | | |
|---|---|---|
| KR | 2011/0085299 A | 7/2011 |
| KR | 2011/0128432 A | 11/2011 |
| KR | 101346325 B1 | 12/2013 |
| KR | 2014/0004372 A | 1/2014 |

OTHER PUBLICATIONS

"Tailored Assembly of Graphene from Solvent Dispersion," Polymer science and technology, v. 2 No. 2, 2011, pp. 130-136 and English translation.

International Search Report PCT/ISA/210 for International Application No. PCT/KR2015/012187 dated Apr. 6, 2016.

Written Opinion of the International Searching Authority PCT/ISA/237 for International Application No. PCT/KR2015/012187 dated Apr. 6, 2016.

\* cited by examiner

[Figure 1]
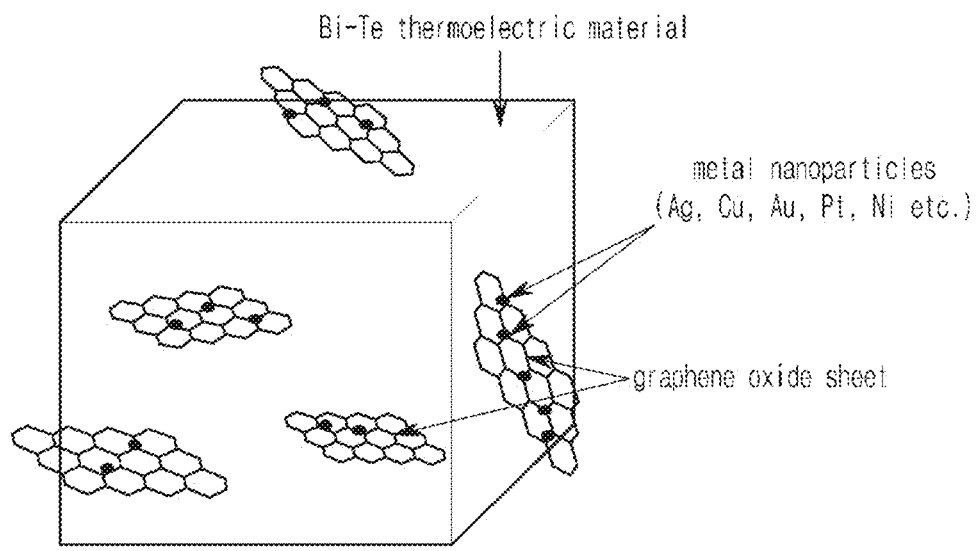
[Figure 2]
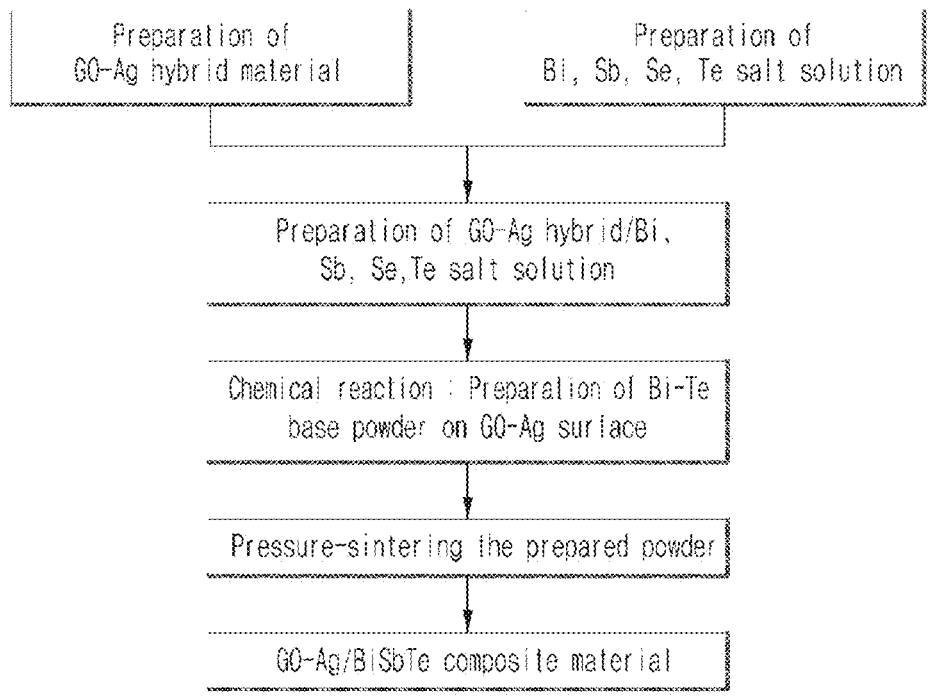

[Figure 3]
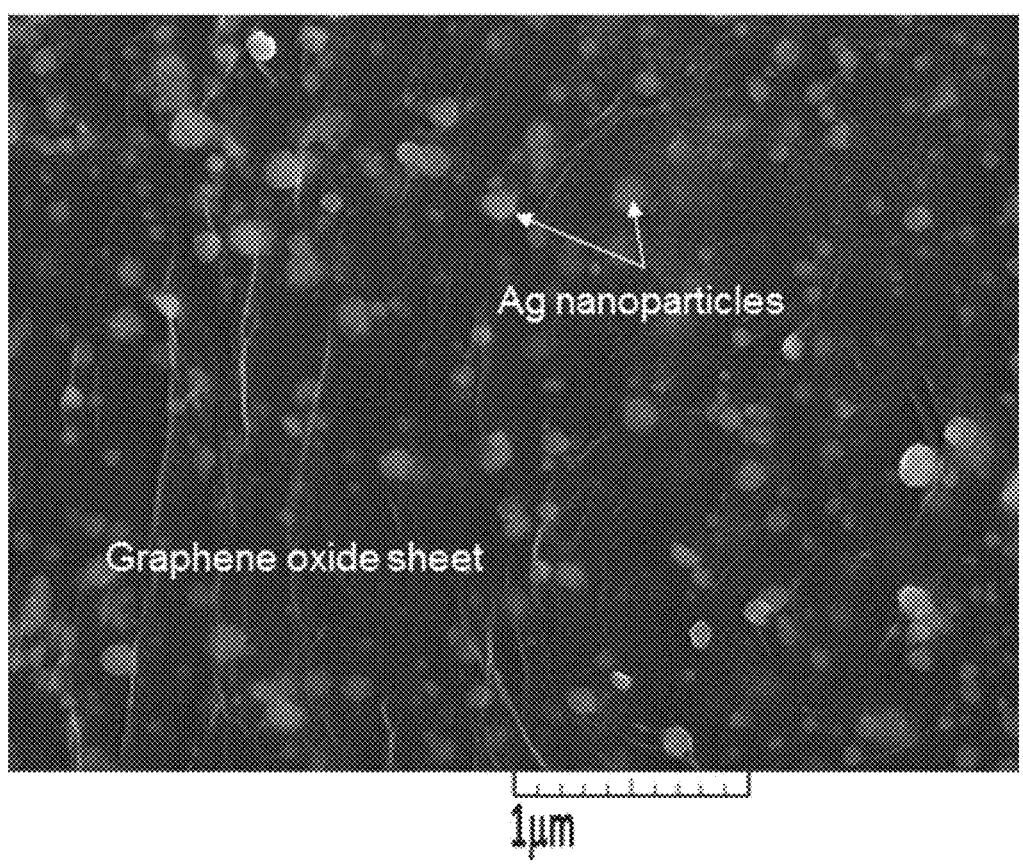

[Figure 4]
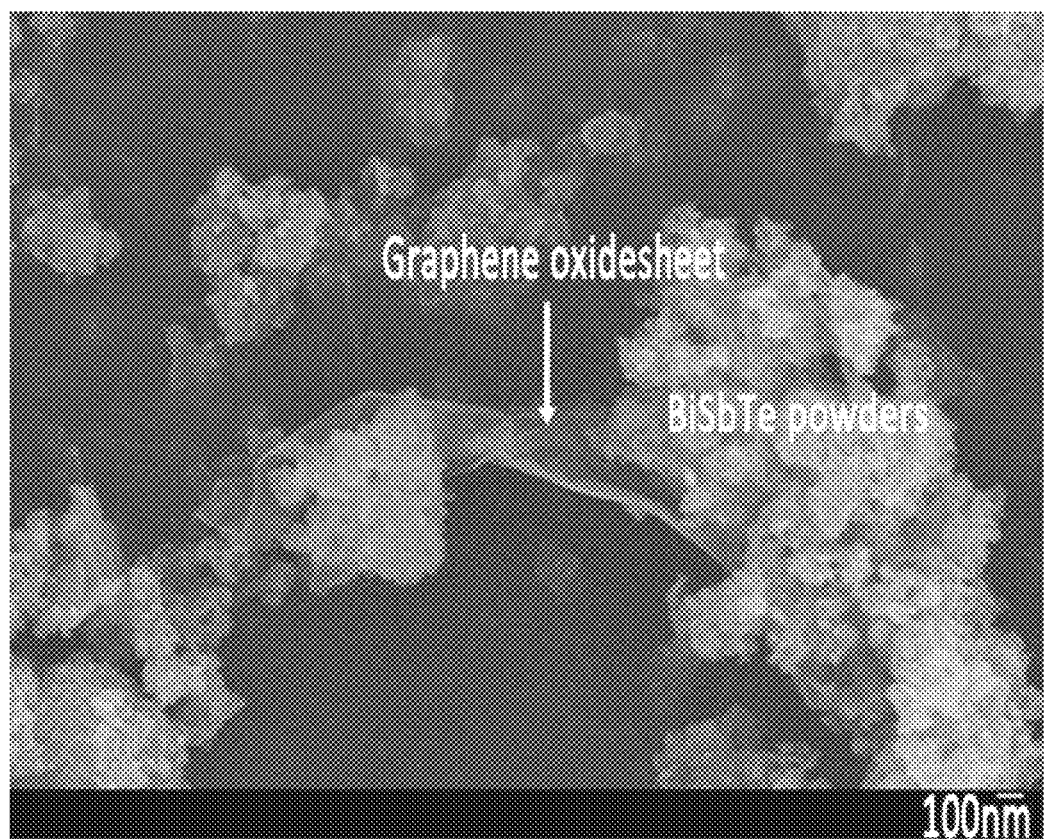

[Figure 5]
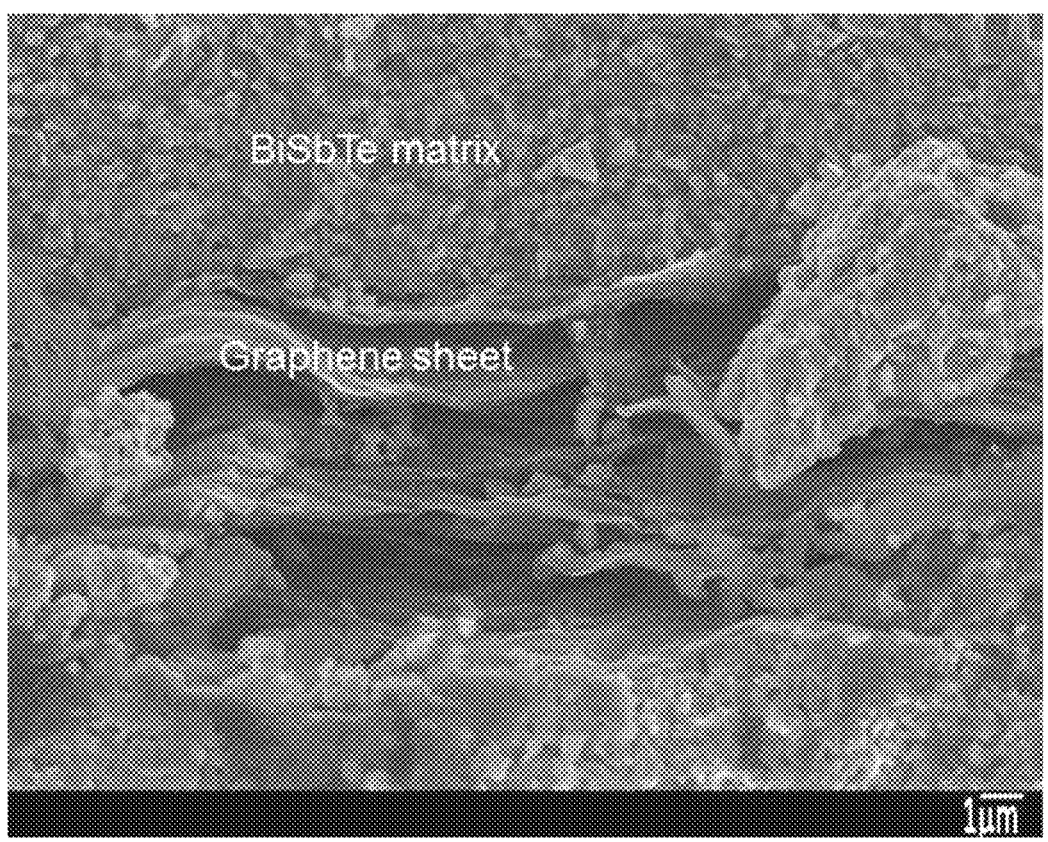

[Figure 6]
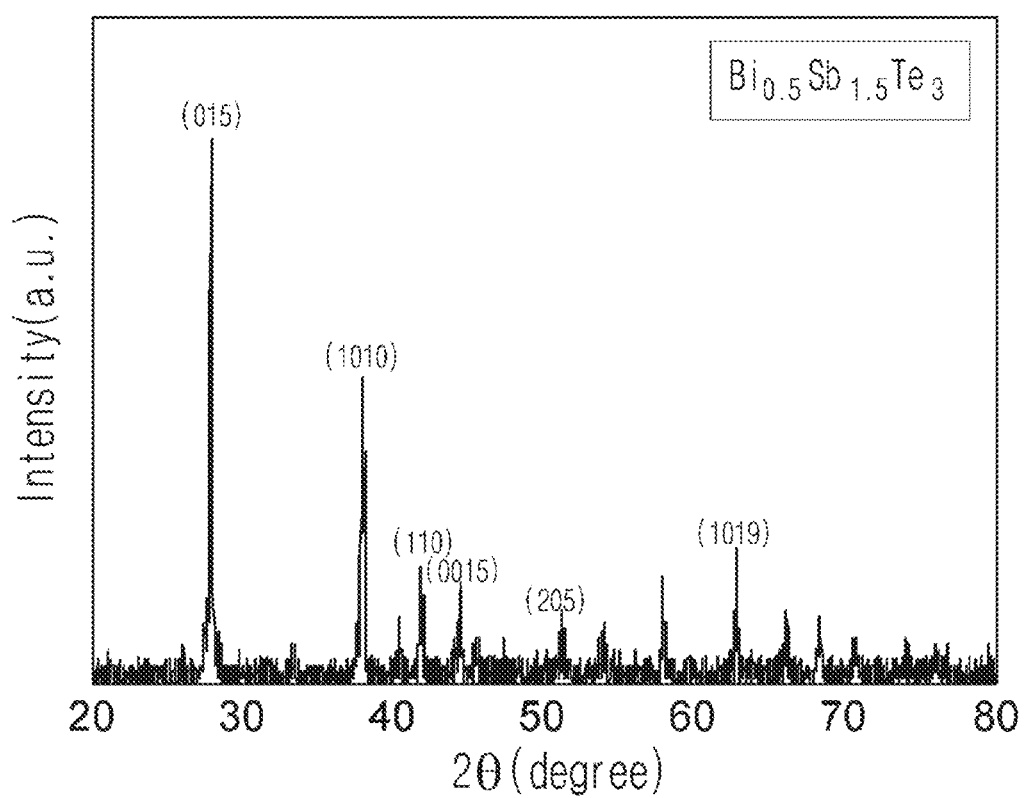

[Figure 7]
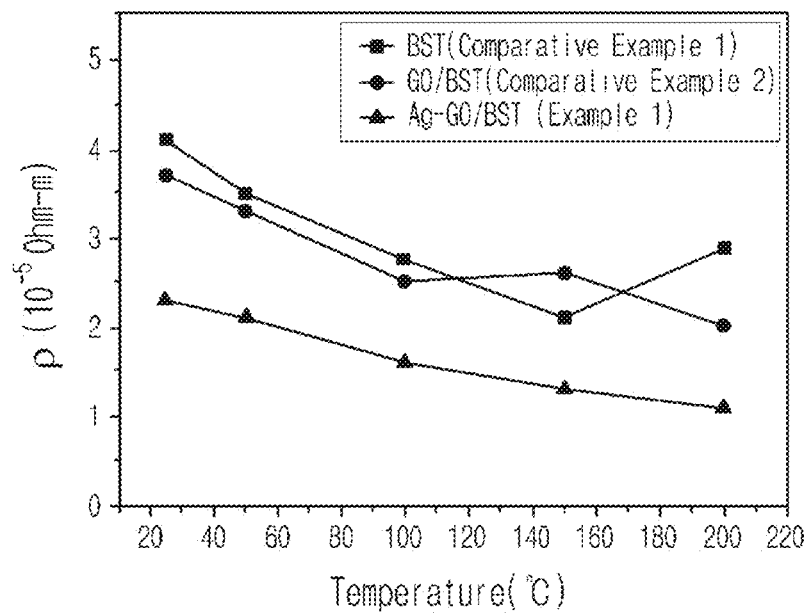
[Figure 8]
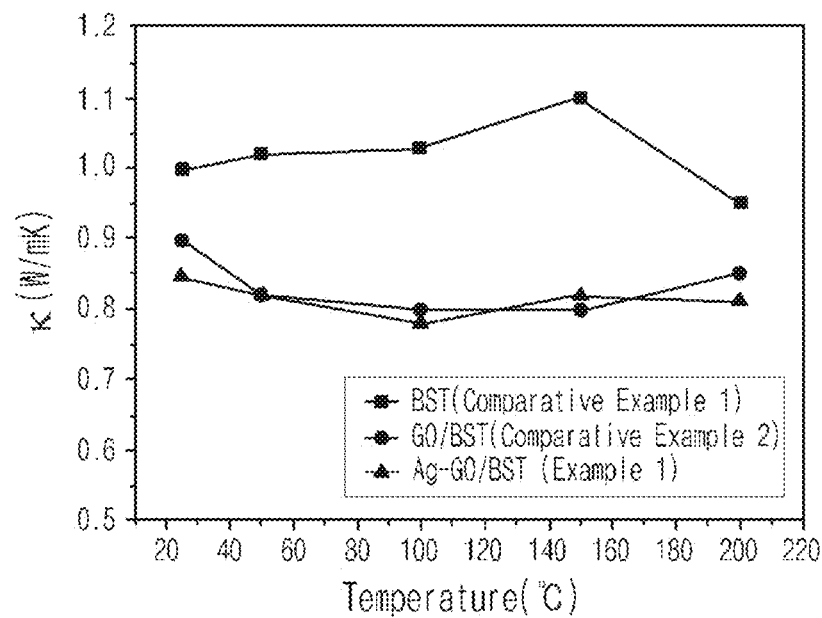

[Figure 10]
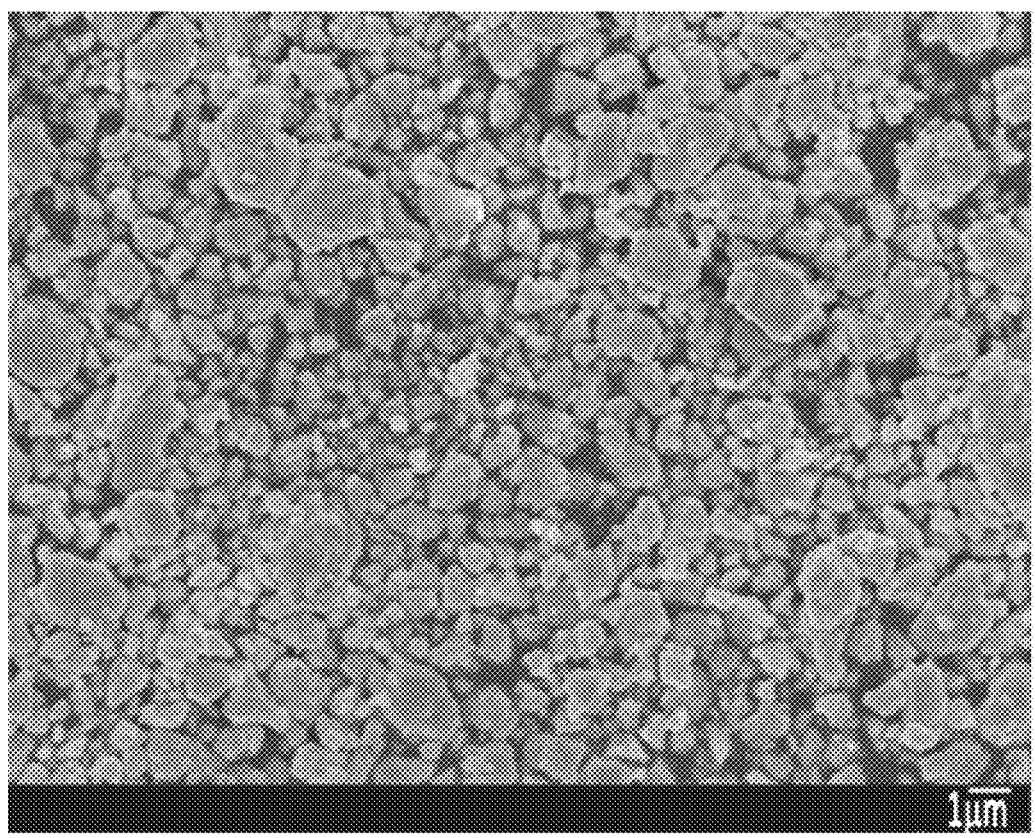

[Figure 11]
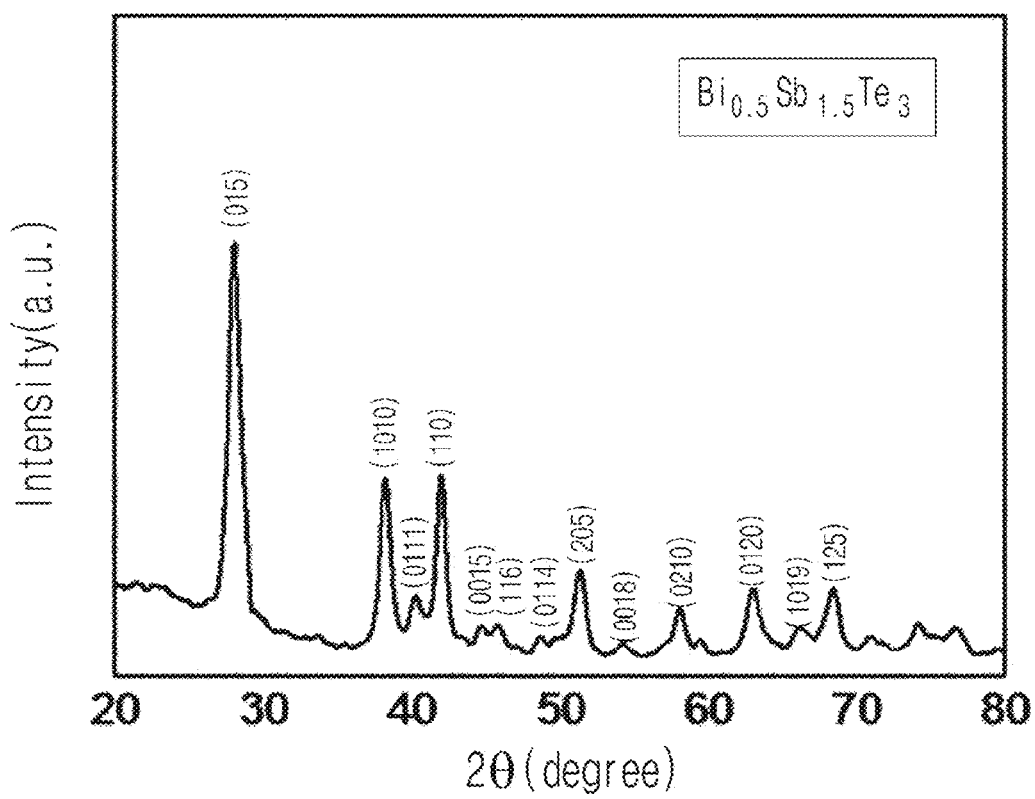

[Figure 12]
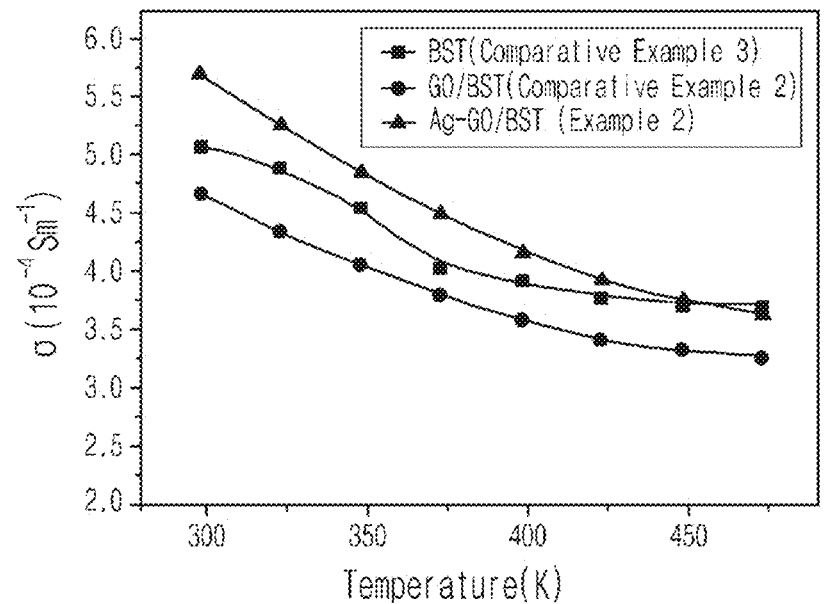
[Figure 13]
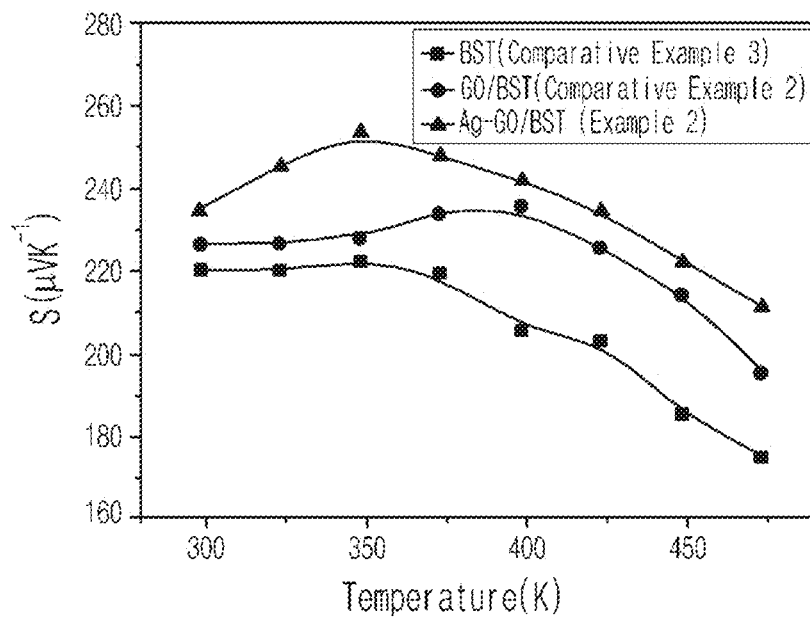

[Figure 14]
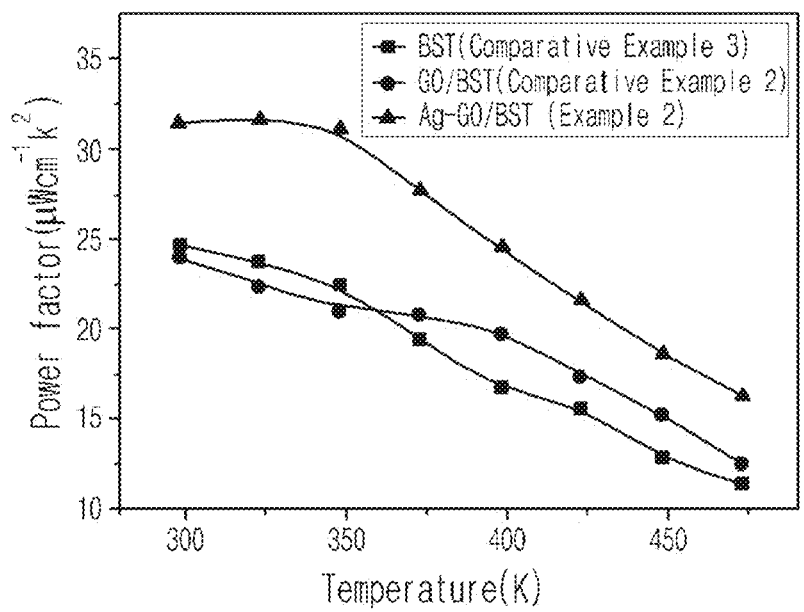
[Figure 15]
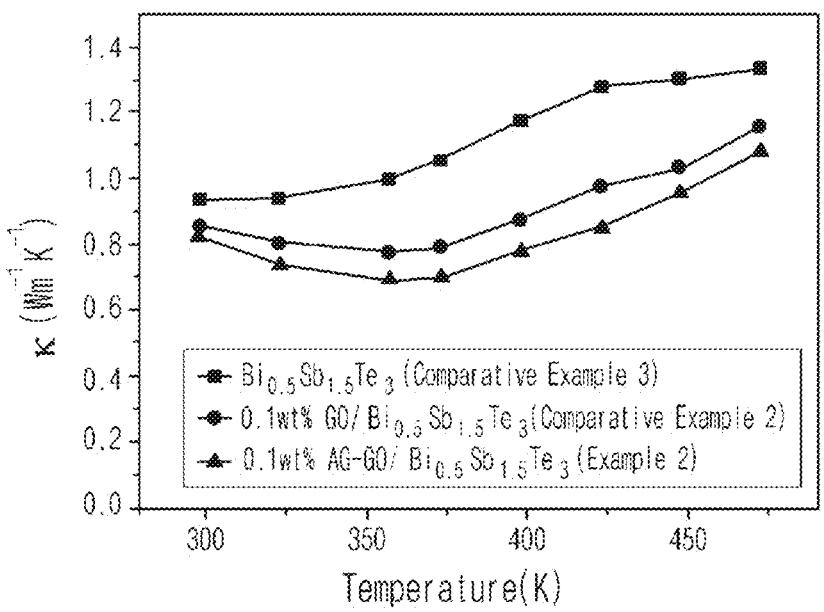

[Figure 16]
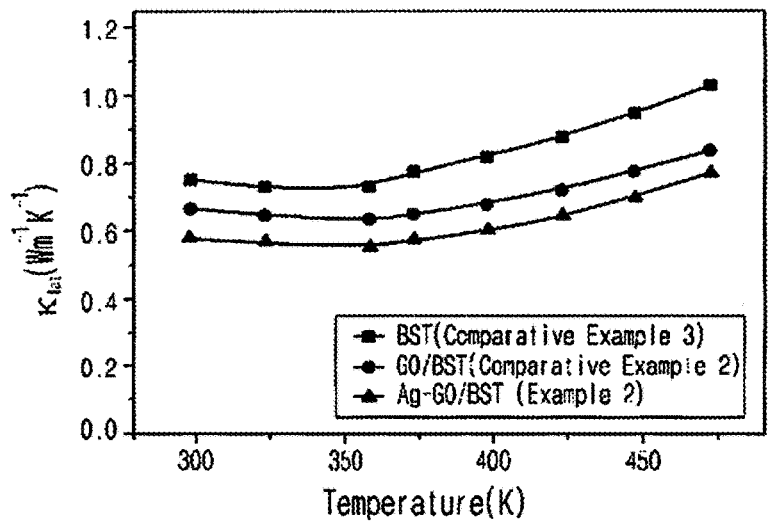
[Figure 17]
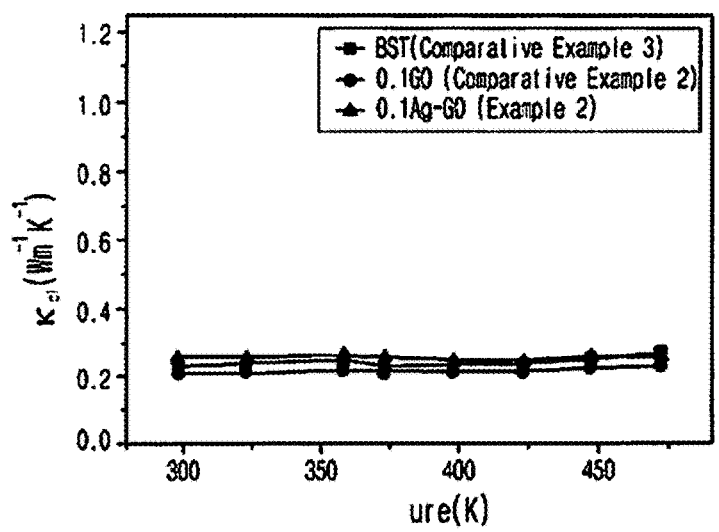

[Figure 18]
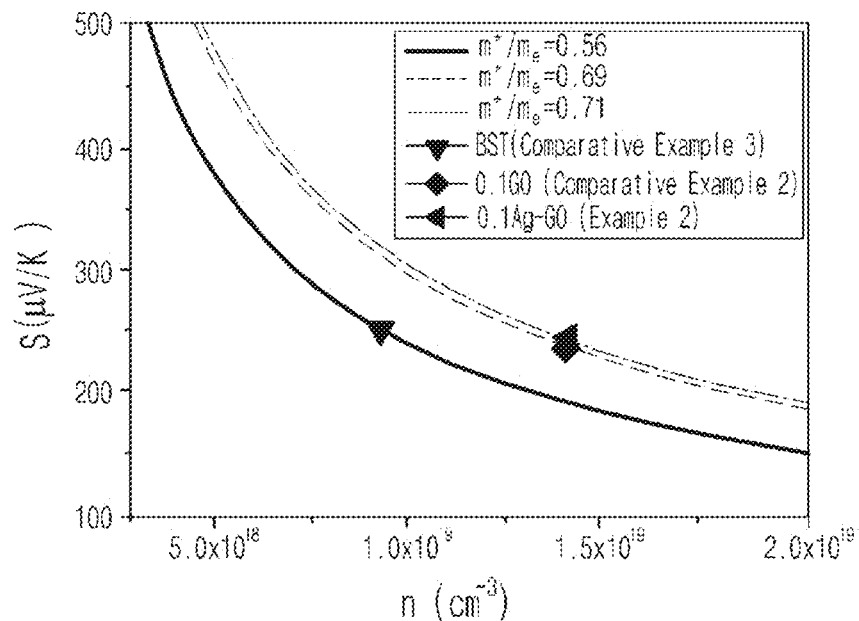
[Figure 19]
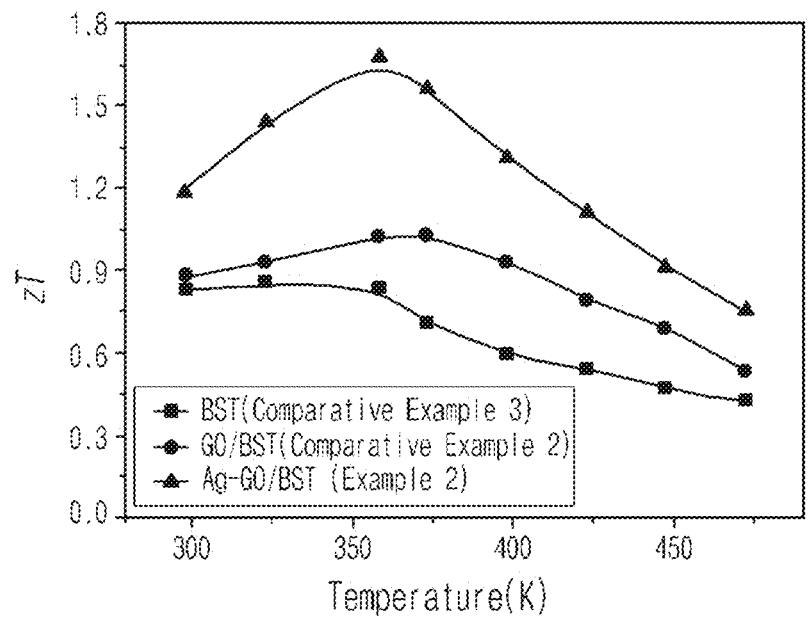

THERMOELECTRIC COMPOSITE MATERIAL AND METHOD FOR PREPARING THERMOELECTRIC COMPOSITE MATERIAL

BACKGROUND OF THE INVENTION

1. Field of the Invention

The present invention relates to a thermoelectric composite material and a method for preparing a thermoelectric composite material. More precisely, the invention relates to a thermoelectric composite material in which graphene oxide attached with conductive metal nanoparticles is dispersed in a thermoelectric material and a method for preparing such a thermoelectric composite material.

2. Description of the Related Art

Thermoelectric materials are the energy conversion materials that can generate electric energy when the temperatures of both ends of the material are different and on the contrary can have different temperatures between both ends of the material when electric energy is given.

After the disclosure of such thermoelectric phenomena as Seebeck effect, Peltier effect, and Thomson effect in the early $19^{th}$ century, a thermoelectric material with a high thermoelectric figure-of-merit has been developed along with the development of a semiconductor since 1930s. Lately, the thermoelectric material has been used as a special power supply unit for the thermoelectric generation for remote mountainous regions, for space industry, and for military purpose; and also used for the precise temperature control by using thermoelectric refrigeration in semiconductor laser diode and infrared sensing element, for the computer related small cooling system and the optical communication laser cooling system, for the chiller-heater cooling system, for the semiconductor temperature control system, and for the heat exchanger, etc.

The thermoelectric performance of a thermoelectric material represented by generation capacity and cooling capacity can be measured by the dimensionless figure-of-merit ZT (mathematical formula 1). High thermoelectric figure-of-merit indicates high energy conversion efficiency of a thermoelectric material. To increase such a thermoelectric figure-of-merit, electrical conductivity and Seebeck coefficient need to be increased but thermal conductivity has to be reduced.

$$ZT = \frac{\sigma \alpha^2}{\kappa} T \quad \langle \text{Mathematical Formula 1} \rangle$$

(σ: Seebeck coefficient, α: electrical conductivity, κ: thermal conductivity, T: absolute temperature)

Among the parameters that affect the thermoelectric figure-of-merit (ZT), Seebeck coefficient and electrical conductivity depend majorly on transporting properties of the charged carriers. As another parameter, thermal conductivity depends on the transporting properties of lattice phonon in the thermoelectric material. Therefore, high the thermoelectric figure-of-merit (ZT) can be achieved by realizing microstructures where the above transporting properties of carriers and phonons are optimized. That is, the carrier scattering in a thermoelectric material needs to be reduced as low as possible while the scattering of phonon in the thermoelectric material needs to be increased to induce the reduction of thermal conductivity, resulting in the improvement of the thermoelectric figure-of-merit (ZT).

To produce a thermoelectric material with a high thermoelectric figure-of-merit (ZT), many studies have been actively going on to prepare a nanostructured thermoelectric materials and composite material with nano-sized dispersion agents in thermoelectric matrix. That is, by introducing nano-meter sized dispersed phase in thermoelectric matrix materials, an interface newly formed between dispersion agent and thermoelectric material, besides grain boundary, is formed and thereby phonon scattering at the interface is actively induced, resulting in the efficient reduction of thermal conductivity. As a result, the thermoelectric figure-of-merit (ZT) can be improved. In general, the wavelength of phonon is 1~2 nm and the wavelength of electron is 10~50 nm. So, if a nano material in the size of under 10 nm is embedded, it is expected to reduce thermal conductivity efficiently without sacrificing electrical conductivity. Therefore, if a thermoelectric material is prepared with the structure where the nano-sized dispersion agent is formed in the crystal grains of the thermoelectric matrix material, advantages can be obtained from both the grain boundary and the newly formed interface thereby, resulting in the improvement of the thermoelectric figure-of-merit (ZT) due to maximized phonon scattering.

The conventional dispersion agents such as $ZrO_2$ and $Al_2O_3$ or the 1-dimensional nano-disperssion agent displayed reduction in the thermal conductivity by formation of achieve phonon scattering of a thermoelectric material but unfortunately reduced electrical conductivity as well, indicating that the improvement of the thermoelectric figure-of-merit was difficult to be achieved.

Korean Patent Publication No. 10-2011-0128432 describes a thermoelectric material and a composite material comprising the said thermoelectric material and a method for preparing the same, wherein the first solution in which carbon nanotubes are dispersed and the second solution containing metal salts are mixed together; a powder mixture prepared by chemical reaction of the mixture above is mechanically pulverized and mixed, followed by heat treatment; and accordingly a thermoelectric material comprising some carbon nanotubes in the inside is produced; and finally a thermoelectric composite material is prepared by spark thermal-plasma sintering process.

However, the method above has disadvantages of complicated preparation process due to the pre-treatment process of carbon nanotubes and the after-treatment process of pulverizing and mixing of the prepared powder mixture: and reduced electrical conductivity due to the damage on the surface structure of the carbon nanotube. According to the method above, the carbon nanotube finished with the pre-treatment process containing acid treatment is used to prepare a thermoelectric material but the electrical conductivity of the carbon nanotube in the thermoelectric material is reduced.

The present inventors studied to establish a method to improve the thermoelectric figure-of-merit of a thermoelectric material. In the course of the study, the present inventors succeeded to prepare a thermoelectric composite material by dispersing the graphene oxide in a 2-dimensional structure attached with conductive nanoparticles which had comparatively excellent electrical conductivity into a thermoelectric material, by which thermal conductivity was efficiently reduced, and thereby thermoelectric figure-of-merit was improved, leading to the completion of the present invention.

SUMMARY OF THE INVENTION

It is an object of the present invention to provide a thermoelectric composite material.

It is another object of the present invention to provide a method for preparing a thermoelectric composite powder.

It is also an object of the present invention to provide a thermoelectric composite powder.

It is further an object of the present invention to provide a method for preparing a thermoelectric composite material.

It is also an object of the present invention to provide a thermoelectric material.

To achieve the above objects, the present invention provides a thermoelectric composite material in which graphene oxide attached with conductive metal nanoparticles is dispersed in a thermoelectric material.

The present invention also provides a method for preparing a thermoelectric composite powder comprising the following steps:

growing conductive metal nanoparticles on the surface of graphene oxide (step 1); and introducing the graphene oxide attached with the conductive metal nanoparticles prepared in step 1 into a thermoelectric material precursor solution, followed by heat treatment (step 2).

Further, the present invention provides a method for preparing a thermoelectric composite powder comprising the following steps:

growing conductive metal nanoparticles on the surface of graphene oxide (step 1); and mixing mechanically the graphene oxide attached with the conductive metal nanoparticles prepared in step 1 with the thermoelectric material powder (step 2).

The present invention also provides a thermoelectric composite powder prepared by the method of the invention above and characteristically containing graphene oxide attached with conductive metal nanoparticles in the thermoelectric material powder.

The present invention also provides a method for preparing a thermoelectric composite material comprising the step of pressure-sintering the thermoelectric composite powder prepared by the method of the invention above at 250~400° C. with the pressure of 30~70 MPa.

The present invention also provides a thermoelectric composite material prepared by the method above.

The present invention also provides a thermoelectric material comprising the thermoelectric composite material above for the electricity generation using waste-heat at room temperature under 450K.

The present invention also provides a thermoelectric material comprising the thermoelectric composite material above for the precise cooling and heating at room temperature under 450K.

Advantageous Effect

According to the thermoelectric composite material of the present invention, the graphene oxide with a two-dimensional structure is used as a nano-sized dispersion agent to allow both surfaces thereof to form new interfaces, thereby maximizing the phonon scattering effect by newly formed interfaces and surfaces, thus exhibiting low thermal conductivity. In addition, the graphene oxide is uniformly dispersed in a thermoelectric matrix material since the graphene oxide is functionalized; the conductive nanoparticles are attached to the graphene oxide, thereby preventing deterioration in electrical conductivity; the graphene oxide can act as a seed to which a thermoelectric material can be attached. Furthermore, a high dimensionless figure-of-merit can be exhibited.

BRIEF DESCRIPTION OF THE DRAWINGS

The application of the preferred embodiments of the present invention is best understood with reference to the accompanying drawings, wherein:

FIG. 1 is a schematic diagram illustrating the structure of the thermoelectric composite material of the present invention;

FIG. 2 is a flow chart illustrating an example of the method for preparing the thermoelectric composite powder of the present invention;

FIG. 3 is a SEM photograph illustrating the graphene oxide attached with silver nanoparticles prepared in step 2 of Example 1;

FIG. 4 is a SEM photograph illustrating the microstructure of the thermoelectric composite powder prepared in step 3 of Example 1;

FIG. 5 is a SEM photograph illustrating the microstructure of the thermoelectric composite material prepared in step 4 of Example 1;

FIG. 6 is a graph illustrating the composition of the thermoelectric composite material prepared in step 4 of Example 1, observed with X-ray diffractometer;

FIG. 7 is a graph illustrating the electrical resistivity of the thermoelectric materials prepared in Example 1 and Comparative Examples 1 and 2;

FIG. 8 is a graph illustrating the thermal conductivity of the thermoelectric materials prepared in Example 1 and Comparative Examples 1 and 2;

FIG. 10 is a SEM photograph illustrating the microstructure of the thermoelectric composite material prepared in Example 2;

FIG. 11 is a graph illustrating the composition of the thermoelectric composite material prepared in Example 2, observed with X-ray diffractometer;

FIGS. 12~15 are graphs illustrating the electrical conductivity, Seebeck coefficient, power factor, and thermal conductivity of the thermoelectric materials prepared in Example 2 and Comparative Examples 3 and 4;

FIG. 16 is a graph illustrating the lattice thermal conductivity of the thermoelectric materials prepared in Example 2 and Comparative Examples 3 and 4;

FIG. 17 is a graph illustrating the charge thermal conductivity of the thermoelectric materials prepared in Example 2 and Comparative Examples 3 and 4;

FIG. 18 is a graph illustrating the Seebeck coefficient plotted for the carrier concentration of the thermoelectric materials prepared in Example 2 and Comparative Examples 3 and 4;

FIG. 19 is a graph illustrating the dimensionless figure-of-merit (ZT) of the thermoelectric materials prepared in Example 2 and Comparative Examples 3 and 4.

DESCRIPTION OF THE PREFERRED EMBODIMENTS

Figure 9:
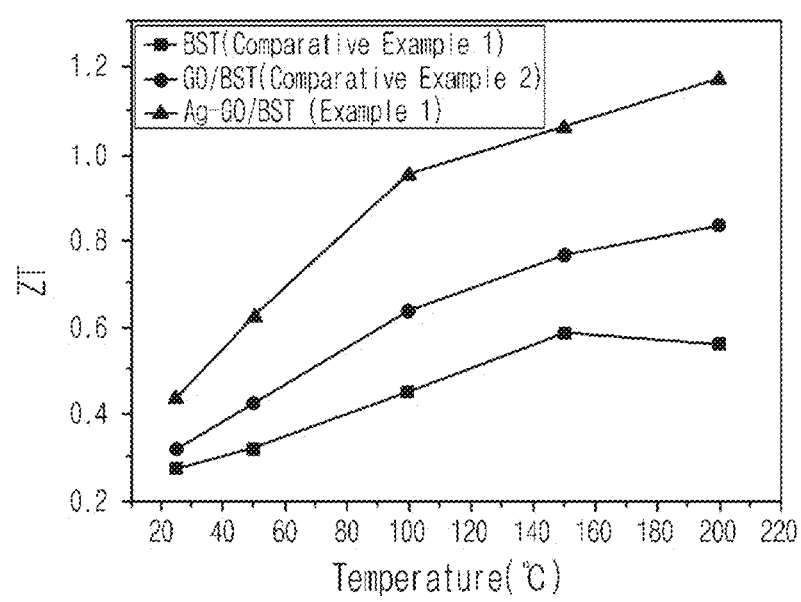
FIG. 9 is a graph illustrating the dimensionless figure-of-merit (ZT) of the thermoelectric materials prepared in Example 1 and Comparative Examples 1 and 2.

Hereinafter, the present invention is described in detail.

The present invention provides a thermoelectric composite material in which graphene oxides attached with conductive metal nanoparticles are dispersed in a thermoelectric material.

A schematic diagram illustrating the thermoelectric composite material of the present invention is presented in FIG. 1.

Hereinafter, the thermoelectric composite material of the invention is described in more detail.

According to the previous art, in order to increase the electrical conductivity but to decrease the thermal conductivity of a thermoelectric material, the nano-sized oxide particles such as $ZrO_2$ and $Al_2O_3$ or the nano-sized dispersion agents having 1-dimensional structure were added to a thermoelectric material to induce phonon scattering effect in the thermoelectric material and thereby to reduce the thermal conductivity. However, the electrical conductivity was also reduced and eventually it was difficult to increase the thermoelectric figure-of-merit. As an alternative conductive nano-sized dispersion agent, carbon nanotube has been proposed. However, in order to disperse the carbon nanotube, the surface has to be treated with a strong acid and this functionalization can cause the decrease of the electrical conductivity.

To solve the said problem, graphene oxide in a 2-dimensional structure is used in this invention as a dispersion agent. A material comprising the 2-dimensional graphene oxide/conductive metal nanoparticles can form new interfaces on both sides, unlike the conventional carbon nanotube in a 1-dimensional linear structure can form a new interface only on the outer side. So, the phonon scattering effect at the newly formed interface and the surface can be synergistically maximized. In this invention, after the functionalization of the graphene oxide, conductive nanoparticles are attached so that the defect of the graphene oxide can be prevented and the deterioration of the electrical conductivity can also be prevented. That is, the oxygen-contained fuctional groups in the graphene oxide of the invention can successfully act as a seed on which a thermoelectric material can be attached.

The thermoelectric composite material of the present invention is advantageous in realizing two different thermal and electric characteristics because it can minimize the thermal conductivity by reducing phonon transfer significantly by using the graphene oxide having the 2-dimensional structure but can maintain or even improve carrier transfer by the attached conductive metal nanoparticles. In this invention, the concept that can minimize heat transfer with maintaining electric properties is defined as thermal meta-materials.

At this time, the metal included in the conductive metal nanoparticle can be one of the metals selected from the group consisting of silver, copper, gold, platinum, and nickel, but not always limited thereto and any metal that can endow an excellent electrical conductivity to a thermoelectric composite material can be used.

The thermoelectric material herein is selected from the group consisting of Bi—Te compounds, Sb—Te compounds, Bi—Sb—Te compounds, Co—Sb compounds, Pb—Te compounds, Ge—Tb compounds, Si—Ge compounds, and Sm—Co compounds, but not always limited thereto. Among them, Bi—Te compounds are preferred.

In the meantime, in the graphene oxide attached with the conductive metal nanoparticles, the conductive metal nanoparticles are growing on the surface of graphene oxide after the functionalization of the graphene oxide. By the completion of the functionalization, the graphene oxide can be homogeneously dispersed in a thermoelectric matrix material and thereby the reduced electrical conductivity caused by the functionalization can be compensated or improved by the attached conductive metal nanoparticles.

The thermoelectric composite material of the invention is characterized by a high dimensionless figure-of-merit (ZT) which is improved as high as 1.2~2.0 times by that of the matrix material in the temperature range of −20~200° C. Such a high dimensionless figure-of-merit resulted from the low thermal conductivity but the improved electrical conductivity of the thermoelectric composite material of the invention is realized by the scattering of the graphene oxide attached with conductive metal nanoparticles.

The present invention also provides a method for preparing a thermoelectric composite powder comprising the following steps:

growing conductive metal nanoparticles on the surface of graphene oxide (step 1); and introducing the graphene oxide attached with the conductive metal nanoparticles prepared in step 1 into a thermoelectric material precursor solution, followed by heat treatment (step 2).

A schematic diagram illustrating the method for preparing a thermoelectric composite powder of the present invention is presented in FIG. 2.

Hereinafter, the method for preparing a thermoelectric composite powder of the present invention is described in more detail step by step.

In the method for preparing a thermoelectric composite powder of the present invention, step 1 is to grow conductive metal nanoparticles on the surface of graphene oxide. In step 1, the electrical conductivity of the thermoelectric composite powder containing the graphene oxide can be improved by growing the conductive metal nanoparticles on the surface of the graphene oxide.

At this time, the metal included in the conductive metal nanoparticle of step 1 can be one of the metals selected from the group consisting of silver, copper, gold, platinum, and nickel, but not always limited thereto and any metal that can endow an excellent electrical conductivity to a thermoelectric composite material can be used.

In the meantime, the surface of the graphene oxide of step 1 can be treated by one or more methods selected from the group consisting of ultrasonic process, acid treatment, and chemical treatment in order to attach a functional group thereto, but not always limited thereto. By the attachment of a functional group via one of the said methods, the graphene oxide can be better dispersed in a thermoelectric matrix material.

The growing of the conductive metal nanoparticles in step 1 can be achieved by heat-treating the conductive metal nanoparticle precursor at 50~150° C. in a basic solution (pH 8~10), but the growing process of the metal nanoparticles is not limited thereto.

In the method for preparing a thermoelectric composite powder of the present invention, step 2 is to introduce the graphene oxide attached with the conductive metal nanoparticles prepared in step 1 into a thermoelectric material precursor solution, followed by heat-treatment. In step 2, the graphene oxide attached with the conductive nanoparticles is dispersed in the thermoelectric material to prepare the thermoelectric composite powder.

At this time, the thermoelectric material precursor solution of step 2 can contain one or more thermoelectric material precursors selected from the group consisting of bismuth acetate, bismuth chloride, bismuth nitrate, tellurium chloride, selenium chloride, and antimony chloride, but not always limited thereto.

In the meantime, the thermoelectric material precursor solution of step 2 can contain a surfactant and a reducing solvent, and at this time, the surfactant can be selected from the group consisting of oleylamine (OLA), trioctylphosphine (TOP), and oleic acid. The reducing solvent can be 1-dodecanethiol, but the surfactant and the reducing solvent above are not limited thereto.

The graphene oxide attached with the conductive metal nanoparticles of step 2 can be introduced in the thermoelectric material precursor solution at the concentration of 0.02~5 weight % by the weight of the precursor solution.

If the concentration of the graphene oxide included in the thermoelectric material precursor solution is less than 0.02 weight %, the phonon scattering effect would be very weak, and if the concentration of the grapheme oxide is more than 5 weight %, coagulation is caused due to the excessive oxide material.

The heat-treatment in step 2 is preferably performed at 90~250° C. for 1~3 hours.

If the heat-treatment in step 2 is performed out of the temperature range above, the reduction of the thermoelectric material cannot be controlled. If the heat-treatment in step 2 is performed for less than an hour, the reduction would not be completed, indicating that the atoms of the thermoelectric material cannot be reduced and accordingly the yield of the thermoelectric material would be decreased. If the heat-treatment continues for more than 3 hours, it would be waste of time and costs.

The present invention also provides a method for preparing a thermoelectric composite powder comprising the following steps:

growing conductive metal nanoparticles on the surface of graphene oxide (step 1); and mixing mechanically the graphene oxide attached with the conductive metal nanoparticles prepared in step 1 with the thermoelectric material powder (step 2).

Hereinafter, the method for preparing a thermoelectric composite powder of the present invention is described in more detail step by step.

In the method for preparing a thermoelectric composite powder of the present invention, step 1 is to grow conductive metal nanoparticles on the surface of graphene oxide. In step 1, the electrical conductivity of the thermoelectric composite powder containing the graphene oxide can be improved by growing the conductive metal nanoparticles on the surface of the graphene oxide.

The step 1 above can be performed by the same manner as described above, so the details are not repeated herein.

In the method for preparing a thermoelectric composite powder of the present invention, step 2 is to mix mechanically the graphene oxide attached with the conductive metal nanoparticles prepared in step 1 with the thermoelectric material powder. By this mechanical mixing, the graphene oxide can be dispersed in the thermoelectric material.

The graphene oxide attached with the conductive metal nanoparticles of step 2 can be introduced in the thermoelectric material powder at the concentration of 0.02~5 weight % by the weight of the thermoelectric material powder.

If the concentration of the graphene oxide included in the thermoelectric material precursor solution is less than 0.02 weight %, the phonon scattering effect would be very weak, and if the concentration of the grapheme oxide is more than 5 weight %, coagulation is caused due to the excessive oxide material.

In step 2, the mixture of the graphene oxide attached with the conductive metal nanoparticles and the thermoelectric material powder can additionally contain graphene oxide.

At t his time, the graphene oxide can be introduced at the concentration of 0.02~5 weight % by the weight of the thermoelectric material powder.

Further, the mechanical mixing in step 2 can be performed by planetary milling process at 250 rpm 1,000 rpm for 1~10 hours.

The present invention also provides a thermoelectric composite powder prepared by the method of the invention above and characteristically containing graphene oxide attached with conductive metal nanoparticles in the thermoelectric material powder.

The thermoelectric composite powder prepared by the method of the invention displays a lower thermal conductivity due to the decrease of phonon scattering caused by the graphene oxide attached with conductive metal nanoparticles which is dispersed in a thermoelectric material powder but an improved electrical conductivity due to the conductive metal nanoparticles included therein.

The present invention also provides a method for preparing a thermoelectric composite material comprising the step of pressure-assisted sintering the thermoelectric composite powder prepared by the method of the invention above at 250~400° C. with the pressure of 30~70 MPa.

The pressure-assisted sintering process above makes the bulking of a thermoelectric composite material that is not suitable for the general sintering to give the bulked thermoelectric composite material.

If the sintering of the thermoelectric composite powder is performed at a temperature less than 250° C., it is difficult to prepare a sintered body with a sufficient density. If the sintering is performed at a temperature higher than 400° C., a sample could be damaged due to a high temperature and costs are wasted.

If the sintering is performed at a pressure less than 30 PMa, it is difficult to prepare a sintered body with a sufficient density and the final sample would have too weak strength to be used. If the sintering is performed at a pressure higher than 70 MPa, it is a waste of costs.

The pressure-assisted sintering can be performed by spark plasma sintering process for 1~30 minutes or by hot press process for 1~2 hours, but not always limited thereto.

The present invention also provides a thermoelectric composite material prepared by the method above.

The present invention also provides a thermoelectric composite material characteristically prepared by the method of the invention above, wherein the electrical resistivity is $0.6~2.5 \times 10^{-5}$ $\Omega$/m, the thermal conductivity is 0.6~1.2 W/mK, and the dimensionless figure-of-merit (ZT) is 0.4~2.0 at −20~200° C.

The thermoelectric composite material prepared by the method of the invention above displays a lower thermal conductivity due to the decrease of phonon scattering caused by the graphene oxide attached with conductive metal nanoparticles which is dispersed in a thermoelectric material powder but an improved electrical conductivity due to the conductive metal nanoparticles included therein. As a result, the composite material can have a high dimensionless figure-of-merit.

The present invention also provides a thermoelectric material comprising the thermoelectric composite material above for the electricity generation using waste-heat at room temperature under 450K.

The present invention also provides a thermoelectric material comprising the thermoelectric composite material above for the precise cooling and heating at room temperature under 450K.

The thermoelectric composite material of the present invention has a high dimensionless figure-of-merit, so that it can be used not only as a low temperature waste-heat conversion material under 450K but also as a thermoelectric material for the precise cooling and heating in the course of power supply. However, the use of the thermoelectric composite material is not limited to the above, and further the thermoelectric material can be applied as a special power supply unit for the thermoelectric generation for remote mountainous regions, for space industry, and for military purpose; and also used for the precise temperature control by using thermoelectric refrigeration in semiconductor laser diode and infrared sensing element, for the computer related small cooling system and the optical communication laser cooling system, for the chiller-heater cooling system, for the semiconductor temperature control system, for the heat exchanger, for the small refrigerator, for the cooling/heating control system of a car seat, etc.

Practical and presently preferred embodiments of the present invention are illustrative as shown in the following Examples.

However, it will be appreciated that those skilled in the art, on consideration of this disclosure, may make modifications and improvements within the spirit and scope of the present invention.

Example 1: Preparation of GO/Ag/BiSbTe Thermoelectric Composite Material 1

Step 1: 1 g of highly oriented polycrystalline graphite was added to sulfuric acid solution, and the mixture was stirred with ultrasonic irradiation for 10 minutes. In the course of the process, the graphite was separated as a thin graphene layer.

Then, 3.5 g of $KMnO_4$ was slowly added to the solution above for 10~15 minutes with stirring in an ice bath. The mixture was stirred mechanically at 35° C. for 2 hours. 5~10 mL of hydrogen peroxide was added to the mixture above, which was stirred until the color changed from green to brown. The final solution was filtered with a glass filter and washed with 10% HCl solution. The obtained powder was dried to give a graphene oxide. During the HCl treatment, a carboxyl group (COOH) or a carbonyl group (CO) containing oxygen was adhered to the surface to prepare a graphene oxide having a functional group attached thereto.

Step 2: 0.003 g of $Ag(NO_3)$ was added to the solution wherein the graphene oxide prepared in step 2 was dispersed at the concentration of 2 mg/ml, and then $NH_3OH$ solution was added thereto to regulate pH of the solution as 10~12. Then, 1.1 ml of hydrazine ($N_2H_2$) solution was added thereto, followed by heating until the temperature reached 95° C. As a result, GO/Ag material containing a graphene oxide on which conductive nanoparticles were grown was prepared, which was dispersed in distilled water.

Step 3: bismuth acetate ($Bi(CH_3COO)_3$), tellurium chloride ($TeCl_4$), and antimony chloride ($SbCl_3$) were added as thermoelectric material precursors at the concentrations of 0.153 g, 0.162 g, and 0.288 g respectively, to which 9 ml of oleylamine was added as a surfactant, and 100 ml of 1-dodecanethiol was added as a reducing solvent, resulting in the preparation of a thermoelectric precursor solution. The GO/Ag material prepared in step 2 was added to the thermoelectric material precursor solution at the concentration of 1 weight % (0.001 g). The solution was heat-treated at 200° C. for 2 hours and as a result, GO/Ag/BiSbTe thermoelectric composite powder was prepared.

Step 4: Pressure-assisted sintering of the thermoelectric composite powder prepared in step 3 was performed by spark plasma sintering process at 350° C. for 10 minutes with the pressure of 70 MPa. As a result, bulk type GO/Ag/BiSbTe thermoelectric composite material was prepared.

Example 2: Preparation of GO/Ag/BiSbTe Thermoelectric Composite Material 2

Step 1: 1 g of highly oriented polycrystalline graphite was added to sulfuric acid solution, and the mixture was stirred with ultrasonic irradiation for 10 minutes. In the course of the process, the graphite was separated as a thin graphene layer.

Then, 3.5 g of $KMnO_4$ was slowly added to the solution above for 10~15 minutes with stirring in an ice bath. The mixture was stirred mechanically at 35° C. for 2 hours. 5~10 mL of hydrogen peroxide was added to the mixture above, which was stirred until the color changed from green to brown. The final solution was filtered with a glass filter and washed with 10% HCl solution. The obtained powder was dried to give a graphene oxide. During the HCl treatment, a carboxyl group (COOH) or a carbonyl group (CO) containing oxygen was adhered to the surface to prepare a graphene oxide having a functional group attached thereto.

Step 2: 0.003 g of $Ag(NO_3)$ was added to the solution wherein the graphene oxide prepared in step 2 was dispersed at the concentration of 2 mg/ml, and then $NH_3OH$ solution was added thereto to regulate pH of the solution as 10~12. Then, 1.1 ml of hydrazine ($N_2H_2$) solution was added thereto, followed by heating until the temperature reached 95° C. As a result, GO/Ag material containing a graphene oxide on which conductive nanoparticles were grown was prepared, which was dispersed in distilled water.

Step 3: The thermoelectric material powder having the composition of $Bi_{0.5}Sb_{1.5}Te_3$ was prepared via mechanical ball milling process, in which the atomic ratio of Bi:SB:TE was 0.5:1.5:3.0. The thermoelectric material powder above was mixed with the GO/Ag material prepared in step 2 (0.1 weight %) and the graphene oxide powder (0.1 weight %) by high energy milling process at 450 rpm for 2~6 hours. As a result, GO/Ag/BiSbTe thermoelectric composite powder was prepared.

Step 4: Pressure-sintering of the thermoelectric composite powder prepared in step 3 was performed by spark plasma sintering process at 350° C. for 10 minutes with the pressure of 30~70 MPa. As a result, bulk type GO/Ag/BiSbTe thermoelectric composite material was prepared.

Comparative Example 1: Preparation of BiSbTe Thermoelectric Material 1

BiSbTe thermoelectric material was prepared by the same manner as described in Example 1 except that the GO/Ag material prepared in step 1 and step 2 of Example was not included.

Comparative Example 2: Preparation of GO/BiSbTe Thermoelectric Composite Material 1

GO/BiSbTe thermoelectric composite material was prepared by the same manner as described in Example 1 except that step 2 of Example 1 was not performed and the graphene oxide prepared in step 1 was added in step 3.

Comparative Example 3: Preparation of BiSbTe Thermoelectric Material 1

BiSbTe thermoelectric material was prepared by the same manner as described in Example 2 except that the GO/Ag material prepared in step 1 and step 2 of Example 2 was not included.

Comparative Example 4: Preparation of GO/BiSbTe Thermoelectric Composite Material 2

GO/BiSbTe thermoelectric composite material was prepared by the same manner as described in Example 2 except that step 2 of Example 2 was not performed and the graphene oxide prepared in step 1 was added in step 3.

Experimental Example 1: Observation of Microstructure and Composition of Thermoelectric Composite Material 1

The microstructure of the thermoelectric material prepared in Example 1 was observed under scanning electron microscope (SEM), and the results are shown in FIG. 3~FIG. 5. The phase of the thermoelectric material prepared in Example 1 was observed with X-ray diffractometer and the results are shown in FIG. 6.

As shown in FIG. 3, silver nanoparticles are attached regularly on the surface of the graphene oxide in the GO/Ag material prepared in step 2.

As shown in FIG. 4, the graphene oxide attached with silver nanoparticles is dispersed in BiSbTe powder in the GO/Ag/BiSbTe thermoelectric composite powder prepared in step 3.

As shown in FIG. 5, the graphene oxide is dispersed in BiSbTe matrix in the Go/Ag/BiSbTe thermoelectric composite material prepared in step 4.

As shown in FIG. 6, the composition of the thermoelectric composite material prepared by the method of the invention was $Bi_{0.5}Sb_{1.5}Te_3$, indicating that the composite material having the base composition of BiSbTe was successfully prepared.

Experimental Example 2: Observation of Thermoelectric Properties of Thermoelectric Composite Material 1

To observe the thermoelectric properties of the thermoelectric materials prepared in Example 1 and Comparative Examples 1 and 2, the electrical resistivity was measured by using Ulvac-Rico Zem-3 and the results are shown in FIG. 7. The thermal conductivity was investigated by Laser flash method using LFA-447 (Netzsch) and converted by using the density and specific heat of each sample. The results are shown in FIG. 8. The dimensionless figure-of-merit was calculated by using all the measured electrical resistivity, Seebeck coefficient, and thermal conductivity above and the results are shown in FIG. 9.

As shown in FIG. 7, the electrical resistivity of the materials of Comparative Examples 1 and 2 was approximately $2\sim4\times10^{-5}$ Ω/m, which was two times as high as that of the material of Example 1 ($1\sim2\times10^{-5}$ Ω/m).

As shown in FIG. 8, the thermal conductivity of the materials of Comparative Example 2 and Example 1 was 0.75~0.9 W/mK and the thermal conductivity of the material of Comparative Example 1 was 0.95~1.1 W/mK, indicating that the material of Comparative Example 1 which did not contain graphene oxide displayed higher thermal conductivity than the materials of Comparative Example 2 and Example 1 containing graphene oxide. Therefore, it was confirmed that the addition of graphene oxide could reduce the thermal conductivity by increasing phonon scattering.

As shown in FIG. 9, ZT of the material of Comparative Example was 0.25~0.6 at the temperature of 20~200° C. ZT of the material of Comparative Example 2 was 0.25~0.8 and ZT of the material of Example 1 was 0.4~1.2.

From the above results, it was confirmed that the material of Comparative Example 1 that did not contain graphene oxide had a higher thermal conductivity and resistivity. The material of Comparative Example 2 that did contain graphene oxide but did not contain metal nanoparticles attached thereto displayed a low thermal conductivity and electrical conductivity.

The thermoelectric material of Example 1 containing graphene oxide attached with metal nanoparticles displayed a high electrical conductivity but a low thermal conductivity, indicating that it showed excellent ZT.

The above results were obtained by the present invention under such conditions described above, and it is expected to obtain a more improved ZT by decreasing the size of the powder prepared according to the present invention or to regulate the content of the graphene oxide or by regulating the size, the amount, and the kinds of metal nanoparticles.

Experimental Example 3: Observation of Microstructure and Composition of Thermoelectric Composite Material 2

The microstructure of the thermoelectric material prepared in Example 2 was observed under scanning electron microscope (SEM), and the results are shown in FIG. 10. The phase of the thermoelectric material prepared in Example 2 was observed with X-ray diffractometer and the results are shown in FIG. 11.

As shown in FIG. 10, it was confirmed that GO/Ag/BiSbTe thermoelectric composite material was produced by mechanical mixing as a powder form.

As shown in FIG. 11, the composition of the thermoelectric composite material prepared according to the method of the invention was $Bi_{0.5}Sb_{1.5}Te_3$ which was the composition of the BiSbTe matrix material.

Experimental Example 4: Characterization of Thermoelectric Properties of Thermoelectric Composite Material 2

To characterize the thermoelectric properties of those thermoelectric materials prepared in Example 2 and Comparative Examples 3 and 4, the electrical conductivity (σ), Seebeck coefficient (S), power factor, and thermal conductivity (κ) were measured and the results are shown in FIG. 12~FIG. 15. The lattice thermal conductivity ($κ_{lat}$) and charge thermal conductivity ($κ_{el}$) were also calculated and the results are shown in FIG. 16 and FIG. 17. The carrier concentration (n) dependent Seebeck coefficient was plotted and the results are shown in FIG. 18. The dimensionless figure-of-merit (ZT) was calculated by using all the measured electrical conductivity, Seebeck coefficient, and thermal conductivity above and the results are shown in FIG. 19.

As shown in FIGS. 12~15, the electrical conductivity of the thermoelectric material of Comparative Example 3 was approximately $3.7\times10^4$ S/m~$5.1\times10^4$ S/m. The electrical conductivity of the thermoelectric material of Comparative Example 4 was approximately $3.7\times10^4$ S/m~$5.7\times10^4$ S/m. In the meantime, the electrical conductivity of the thermoelectric material of Example 2 was approximately was as low as approximately $3.7\times10^4$ S/m~$4.7\times10^4$ S/m.

Therefore, it was confirmed that the material of Example 2 had a lower thermal conductivity than those materials of Comparative Examples 3 and 4.

Further, the Seebeck coefficient of the material of Example 2 of the invention was higher than that of those materials of Comparative Examples 3 and 4.

As shown in FIG. 16 and FIG. 17, the material of Example 2 was confirmed to have a low thermal conductivity, supported by the results of $\kappa_{lat}$ and $\kappa_{el}$. That is, although three examples shows similar $\kappa_{el}$ values, GO/Ag/BiSbTe thermoelectric composite material displays the lowest $\kappa_{lat}$ value among them. the phonon scattering was actively occurred in the GO/Ag/BiSbTe material.

As shown in FIG. 18, the Seebeck coefficient of the GO/Ag/BiSbTe thermoelectric composite material of Example 2 was increased. That was understood because of the relative increase of effective mass (m*) in the following mathematical formula 1.

$$\alpha = \frac{8\pi^2 k_b^2}{3eh^2} m^* T \left(\frac{\pi}{3n}\right)^{2/3} \qquad \langle \text{Mathematical Formula 1} \rangle$$

As shown in FIG. 19, the maximum ZT of the thermoelectric composite material of the present invention prepared in Example 2 was as excellent as about 1.7 at 350 K.

The above results were obtained by the present invention under such conditions described above, and it is expected to obtain a more improved ZT by reducing the size of the powder prepared according to the present invention or to regulate the content of the graphene oxide or by regulating the size, the amount, and the kinds of metal nanoparticles.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

What is claimed is:

1. A thermoelectric composite material comprising:
   a functionalized graphene oxide including conductive metal nanoparticles on a surface of the functionalized graphene oxide, the functionalized graphene oxide being dispersed in a thermoelectric material.

2. The thermoelectric composite material according to claim 1, wherein the metal of the conductive metal nanoparticles is one or more metals selected from the group consisting of silver, copper, gold, platinum, and nickel.

3. The thermoelectric composite material according to claim 1, wherein the thermoelectric material is one or more compounds selected from the group consisting of Bi—Te compounds, Sb—Te compounds, Bi—Sb—Te compounds, Co—Sb compounds, Pd—Te compounds, Ge—Tb compounds, Si—Ge compounds, and Sm—Co compounds.

4. The thermoelectric composite material according to claim 1, wherein the graphene oxide including conductive metal nanoparticles on the surface of the graphene oxide is prepared by growing the conductive metal nanoparticles on the surface of the graphene oxide after a functionalization of the graphene oxide.

5. The thermoelectric composite material according to claim 1, wherein a dimensionless figure-of-merit (ZT) of the thermoelectric composite material is improved at least as much as 1.2 times ~2.0 times by that of the thermoelectric material in a temperature range of −20~200° C.

6. A method for preparing a thermoelectric composite powder comprising the following steps:
   growing conductive metal nanoparticles on a surface of a functionalized graphene oxide (step 1); and
   introducing the functionalized graphene oxide including the conductive metal nanoparticles on the surface of the functionalized graphene oxide prepared in step 1 into a thermoelectric material precursor solution, followed by a heat treatment (step 2), the functionalized graphene oxide being dispersed in the thermoelectric material.

7. The method for preparing the thermoelectric composite powder according to claim 6, wherein the metal of the conductive metal nanoparticles is one or more metals selected from the group consisting of silver, copper, gold, platinum, and nickel.

8. The method for preparing the thermoelectric composite powder according to claim 6, wherein the surface of the functionalized graphene oxide of step 1 is attached with a functional group by one or more methods selected from the group consisting of ultrasonic process, acid treatment, and chemical treatment.

9. The method for preparing the thermoelectric composite powder according to claim 6, wherein the growing of the conductive metal nanoparticles in step 1 is achieved by heat-treating a conductive metal nanoparticle precursor at 50 ~150° C. in a basic solution (pH 8 ~10).

10. The method for preparing the thermoelectric composite powder according to claim 6, wherein the thermoelectric material precursor solution of step 2 contains one or more thermoelectric material precursors selected from a group consisting of bismuth acetate, bismuth chloride, bismuth nitrate, tellurium chloride, selenium chloride, and antimony chloride.

11. The method for preparing the thermoelectric composite powder according to claim 6, wherein the thermoelectric material precursor solution of step 2 contains a surfactant and a reducing solvent.

12. The method for preparing the thermoelectric composite powder according to claim 11, wherein the surfactant is one or more materials selected from the group consisting of oleylamine (OLA), trioctylphosphine (TOP), and oleic acid.

13. The method for preparing the thermoelectric composite powder according to claim 11, wherein the reducing solvent is 1-dodecanethiol.

14. The method for preparing the thermoelectric composite powder according to claim 6, wherein the functionalized graphene oxide including the conductive metal nanoparticles on the surface of the functionalized graphene oxide of step 2 is introduced in the thermoelectric material precursor solution at a concentration of 0.02 weight% ~5 weight% of the solution.

15. The method for preparing the thermoelectric composite powder according to claim 6, wherein the heat treatment in step 2 is performed at 90 ~250° C. for 1~3 hours.

16. A method for preparing a thermoelectric composite powder comprising the following steps:
   growing conductive metal nanoparticles on a surface of a functionalized graphene oxide (step 1); and
   mixing mechanically the functionalized graphene oxide including the conductive metal nanoparticles on the surface of the functionalized graphene oxide prepared in step 1 with a thermoelectric material powder (step 2), the functionalized graphene oxide being dispersed in the thermoelectric material.

* * * * *